(12) United States Patent
Ariyoshi et al.

(10) Patent No.: US 7,525,364 B2
(45) Date of Patent: Apr. 28, 2009

(54) DELAY CONTROL CIRCUIT

(75) Inventors: Katsuhiko Ariyoshi, Yokohama (JP); Souyou Setsu, Yokohama (JP); Ryusuke Obara, Yokohama (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/493,622

(22) Filed: Jul. 27, 2006

(65) Prior Publication Data

US 2007/0222494 A1 Sep. 27, 2007

(30) Foreign Application Priority Data

Mar. 23, 2006 (JP) .............................. 2006-081698

(51) Int. Cl.
 *H03H 11/26* (2006.01)
(52) U.S. Cl. ..................... 327/276; 327/278; 327/155; 327/161
(58) Field of Classification Search ............. None
 See application file for complete search history.

(56) References Cited

U.S. PATENT DOCUMENTS

| | | | |
|---|---|---|---|
| 6,181,184 B1 | 1/2001 | Yamazaki et al. | |
| 6,426,900 B1 | 7/2002 | Maruyama et al. | |
| 6,549,052 B2 * | 4/2003 | Okayasu | 327/276 |
| 6,621,315 B2 | 9/2003 | Heo et al. | |
| 6,859,081 B2 * | 2/2005 | Hong et al. | 327/175 |
| 6,934,215 B2 * | 8/2005 | Chung et al. | 365/233 |
| 7,199,629 B2 * | 4/2007 | Minzoni | 327/158 |
| 7,202,721 B2 * | 4/2007 | Jeon | 327/158 |
| 2004/0095174 A1 | 5/2004 | Hong et al. | |
| 2005/0175135 A1 | 8/2005 | Dosaka | |

FOREIGN PATENT DOCUMENTS

| | | |
|---|---|---|
| GB | 2 331 416 A | 5/1999 |
| JP | 11-55091 A | 2/1999 |
| JP | 2002-230972 A | 8/2002 |
| JP | 2003-203481 A | 7/2003 |
| JP | 2004-208152 A | 7/2004 |

* cited by examiner

*Primary Examiner*—An T Luu
(74) *Attorney, Agent, or Firm*—Fujitsu Patent Center

(57) ABSTRACT

A first variable delay circuit delays an input signal, introduces a first delay into a first edge of the input signal, and generates a first delay signal. A second variable delay circuit delays the input signal, introduces a second delay into a second edge, and generates a second delay signal. A control circuit controls the first variable delay circuit and the second variable delay circuit such that the first delay and the second delay are identical. A generation circuit combines the first edge of the first delay signal and the second edge of the second delay signal, and generates a third delay signal.

11 Claims, 14 Drawing Sheets

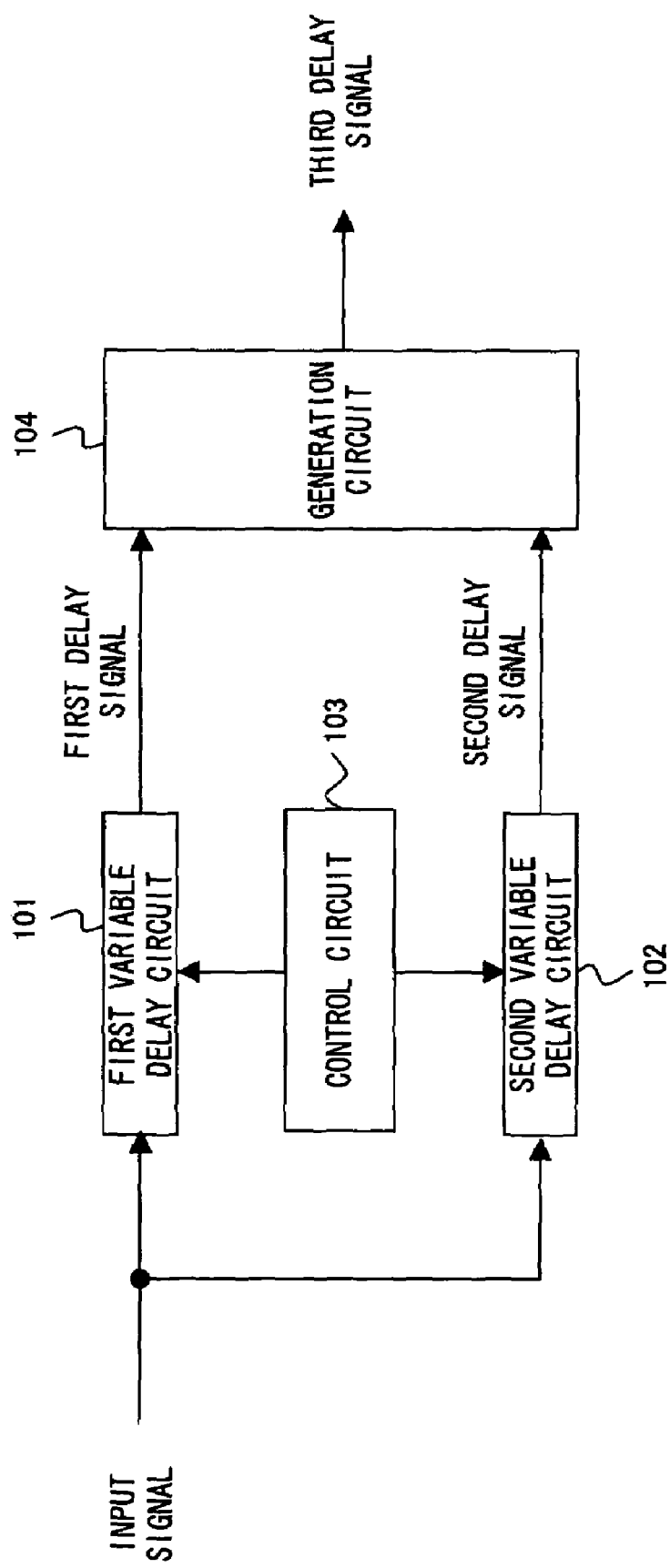
F I G. 1

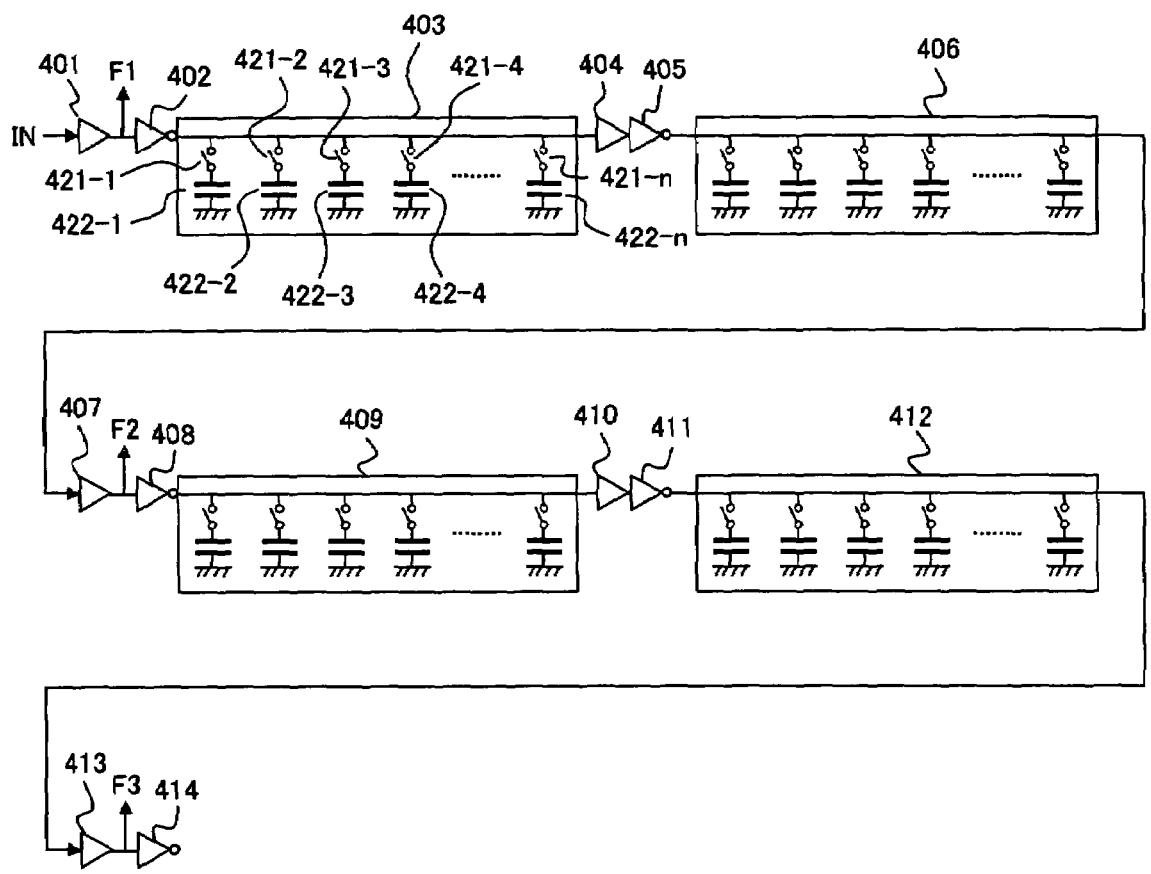
F I G. 4

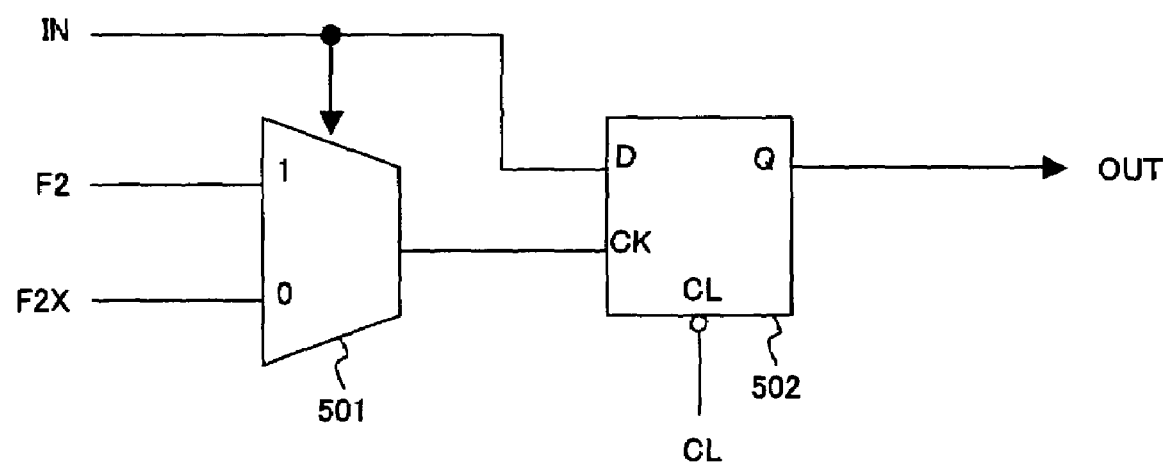
F I G. 5

DELAY CONTROL CIRCUIT

CROSS REFERENCE TO RELATED APPLICATIONS

This application is based upon and claims the benefit of priority from the prior Japanese Patent Application No. 2006-081698, filed Mar. 23, 2006, the entire contents of which are incorporated herein by this reference.

BACKGROUND OF THE INVENTION

1. Field of the Invention

The present invention relates to a delay control circuit for introducing an arbitrary delay into a signal.

2. Description of the Related Art

Generally, there are two ways below for introducing the arbitrary delay (or an arbitrary phase difference) into a clock signal or the like.
(1) PLL (Phase Locked Loop) or DLL (Delay Locked Loop)
(2) Buffer for desired delay The Patent Document 1 below discloses a variable delay circuit for controlling a delay time by changing a gate capacity of a transistor which is parallelly connected to a transmission path of a signal. The Patent Document 2 discloses a DLL circuit which is used for a memory device. The Patent Document 3 discloses a highly accurate PLL circuit. The Patent Document 4 discloses a synchronous type semiconductor memory device including the DLL circuit.
Patent Document 1
  Japanese Patent Application Publication No. 11-055091
Patent Document 2
  Japanese Patent Application Publication No. 2003-203481
Patent Document 3
  Japanese Patent Application Publication No. 2004-208152
Patent Document 4
  Japanese Patent Application Publication No. 2002-230972

In the conventional techniques of the PLL and DLL, although a highly accurate control is realized, the circuit area is large and the power consumption is high in the case of implementation as an analog circuit. Also, an external terminal may be required for a capacitor or the like prepared externally. A delay buffer can be manufactured easily, however, the accuracy is lowered than in the case of the PLL and the DLL.

When it is desired to introduce the arbitrary delay, especially a highly accurate and relatively large delay, into the clock signal in a conventional technique, it is difficult to realize a configuration of a small area and low power consumption simultaneously.

SUMMARY OF THE INVENTION

It is an object of the present invention to provide a delay control circuit which can maintain acceptable accuracy while being of a small area and low power consumption.

A delay control circuit according to the present invention comprises a first variable delay circuit, a second variable delay circuit, a control circuit, and a generation circuit.

The first variable delay circuit delays an input signal, introduces a first delay into a first edge which is one of rising and falling edges of the input signal, and generates a first delay signal. The second variable delay circuit delays the above input signal, introduces a second delay into a second edge which is the other edge of the input signal, and generates a second delay signal.

The control circuit generates a control signal for controlling the first variable delay circuit and the second variable delay circuit such that the first delay and the second delay are identical. The generation circuit combines the first edge of the first delay signal and the second edge of the second delay signal, and generates a third delay signal.

BRIEF DESCRIPTION OF THE DRAWINGS

FIG. 1 is a principle view of a delay control circuit according to the present invention;
FIG. 4 shows a configuration of a first variable delay circuit;
FIG. 5 shows a configuration of a duty ratio correction circuit.

DESCRIPTION OF THE PREFERRED EMBODIMENT

Figure 2:
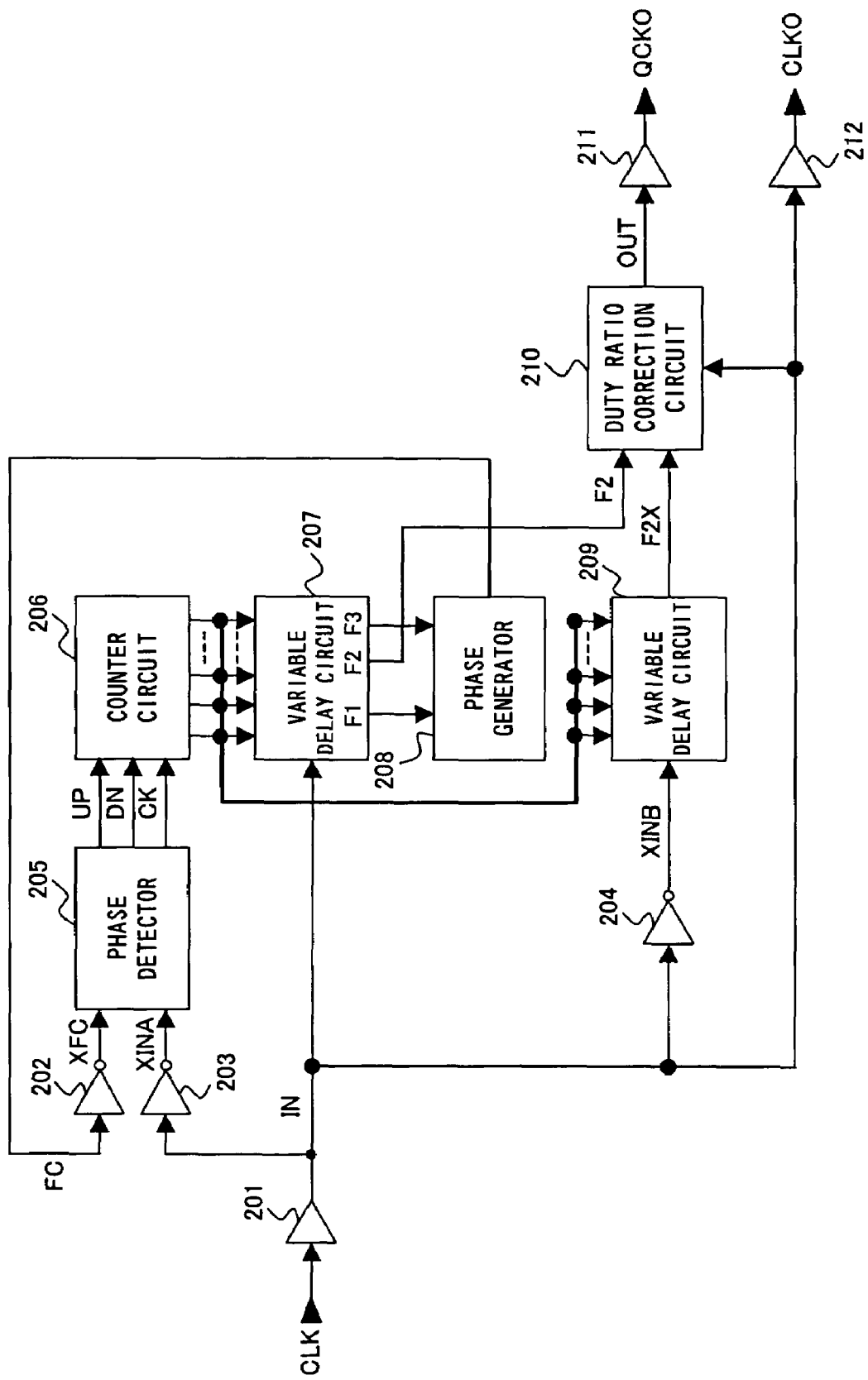
FIG. 2 shows a configuration of a delay correction loop circuit.

Hereinbelow, the most preferred embodiment for implementing the present invention is explained in detail, by referring to the drawings.

FIG. 1 is a principle view of a delay control circuit according to the present invention. The delay control circuit of FIG. 1 comprises a first variable delay circuit 101, a second variable delay circuit 102, a control circuit 103, and a generation circuit 104.

The first variable delay circuit 101 delays an input signal, introduces a first delay into a first edge which is one of rising and falling edges of the input signal, and generates a first delay signal. The second variable delay circuit 102 delays the above input signal, introduces a second delay into a second edge which is the other edge of the input signal, and generates a second delay signal.

The control circuit 103 generates a control signal for controlling the first variable delay circuit 101 and the second variable delay circuit 102 such that the first delay and the second delay are identical. The generation circuit 104 combines the first edge of the first delay signal and the second edge of the second delay signal, and generates a third delay signal.

The first delay signal is generated through a process in which the first delay is introduced into the first edge of the input signal in the first variable delay circuit 101, and is output to the generation circuit 104. The second delay signal is generated through a process in which the second delay is introduced into the second edge of the input signal in the second variable delay circuit 102, and is output to the generation circuit 104. The generation circuit 104 extracts the first edge from the first delay signal, extracts the second edge from the second delay signal, and generates the third delay signal consisting of the two edges extracted.

It is possible to reduce irregularity and adjust edge delay accurately even when a relatively large delay is introduced in the respective variable delay circuits by introducing delay into one edge of the input signal concentratedly. The third delay signal consisting of the first and second edges adjusted as above has highly accurate edges.

Further, because the control circuit 103 performs the control such that the first delay and the second delay are identical, the third delay signal has the same and highly accurate delays on both edges. Accordingly, a duty ratio variation of the third delay signal is prevented.

The first variable delay circuit 101, the second variable delay circuit 102, and the generation circuit 104 respectively correspond, for example, to a variable delay circuit 207, a variable delay circuit 209, and a duty ratio correction circuit 210 of FIG. 2 which will be explained later. The control circuit 103 corresponds, for example, to inverters 202 and 203, a phase detector 205, a counter circuit 206, and a phase generator 208.

According to the present invention, by concentrating the delay adjustment on one edge, it is possible to prevent irregularity of linearity of adjustment interval due to an environment, processes or the like from occurring when introducing a large delay, and a highly accurate delay signal is obtained.

Also, because an analog circuit such as the conventional PLL and DLL is not required, a circuit configuration of a small area and low power consumption can be realized. Further, because an external component is not required, the number of external terminals can be reduced.

FIG. 2 shows a configuration example of a delay correction loop (DCL) circuit as an embodiment of the delay control circuit. This DCL circuit comprises buffers 201, 211, 212, the inverters 202, 203, and 204, the phase detector 205, the counter circuit 206, the variable delay circuits 207 and 209, the phase generator 208, and the duty ratio correction circuit 210, and outputs a signal QCKO having an arbitrary phase difference with respect to an input clock signal CLK.

The buffer 201 outputs the clock signal CLK as a signal IN. The inverter 204 inverts the signal IN, and outputs the signal to the variable delay circuit 209 as a signal XINB. The variable delay circuits 207 and 209 respectively comprise a plurality of delay blocks. The variable delay circuit 207 generates a signal F1 and delay signals F2 and F3 from the signal IN. The variable delay circuit 209 generates a delay signal F2X from the signal XINB.

The variable delay circuit 209 comprises the same delay elements as those of the variable delay circuit 207. In the variable delay circuit 209, a control is performed such that delay values of the rising and falling edges of the signal F2X are respectively the same as the delay values of the falling and rising edges of the signal F2.

The duty ratio correction circuit 210 corrects the duty ratio variation of the delay signal F2 by using the delay signal F2X, and outputs the corrected delay signal OUT. The buffer 211 outputs the signal OUT as the signal QCKO. The buffer 212 outputs the signal IN as a signal CLKO.

The phase generator 208 generates the signal FC to be used for phase comparison from the signals F1 and F3. The inverter 202 inverts the signal FC, and outputs the inverted signal to the phase detector 205 as a signal XFC. The inverter 203 inverts the signal IN, and outputs the inverted signal to the phase detector 205 as a signal XINA.

The phase detector 205 compares phases of the signal XFC and the signal XINA, and generates a delay increase signal UP, a delay decrease signal DN, and a clock signal CK. The counter circuit 206 performs a count operation corresponding to the signal UP and signal DN in accordance with the clock signal CK, and outputs a control signal which is common to the variable delay circuits 207 and 209. Based on this control signal, the delays of the variable delay circuits 207 and 209 are increased/decreased.

As above, the phase generator 208, the inverter 202, the phase detector 205, and the counter circuit 206 constitutes a loop circuit for generating a control signal based on the output signal of the variable delay circuit 207. This loop circuit does not require a capacitor of a large capacitance, accordingly, a circuit configuration of a small area and low power consumption can be realized. Also, an external component is not required, accordingly, the number of external terminals can be reduced.

Figure 3:
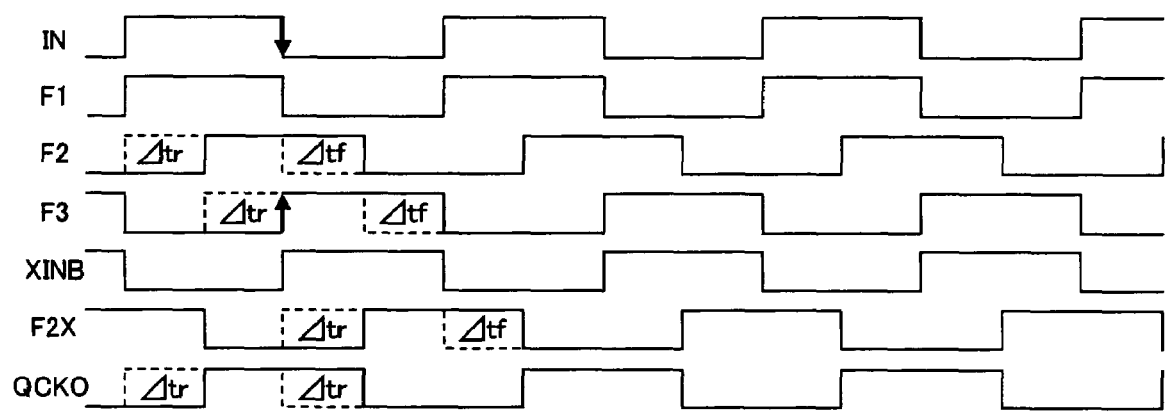
FIG. 3 shows a timing chart for the delay correction loop circuit.

FIG. 3 shows a timing chart showing operations in the case that the phase difference between the input signal CLK of the DCL circuit and the output signal QCKO is ninety degrees. In this example, among three output signals of the variable delay circuit 207, a signal F1 is in phase with a signal IN, and a rising edge of a signal F2 is delayed from a rising edge of the signal IN by $\Delta tr$. A falling edge of the signal F2 is delayed from a falling edge of the signal IN by $\Delta tf$. A rising edge of a signal F3 is delayed from the rising edge of the signal IN by $2\Delta tr$, and a falling edge of the signal F3 is delayed from the falling edge of the signal IN by $2\Delta tf$.

When it is assumed that a cycle of the clock signal CLK is T, the rising edge of the signal F2 is delayed from the rising edge of the signal IN by T/4 if the falling edge of the signal IN aligns with the rising edge of the signal F3.

To the contrary, a rising edge of an output signal F2X of the variable delay circuit 209 coincides with a falling edge of the signal F2, and is delayed from a rising edge of the signal XINB by $\Delta tr$. Also, a falling edge of the signal F2X coincides with the rising edge of the signal F2, and is delayed from the falling edge of the signal XINB by $\Delta tf$.

In this case, when the rising edge of the signal QCKO is made to coincide with the rising edge of the signal F2, and the falling edge of the signal QCKO is made to coincide with the rising edge of the signal F2X by the duty ratio correction circuit 210, both edges of the signal QCKO are respectively delayed from corresponding edges of the signal IN by the same value $\Delta tr$. Accordingly, the delay signal QCKO without the duty ratio variation is obtained.

As above, by adjusting both edges independently by separate variable delay circuits, and merging the adjustment results by the duty ratio correction circuit 210, the duty ratio variation can be suppressed.

Next, the configuration and the operation of the DCL circuit of FIG. 2 will be specifically explained, by referring to FIG. 4 through FIG. 11.

FIG. 4 shows a configuration example of the variable delay circuit 207 using a load capacitor which can be switched by a switch. This variable delay circuit comprises buffers 401, 404, 407, 410 and 413, inverters 402, 405, 408, 411 and 414, and delay blocks 403, 406, 409 and 412. The variable delay circuit has delay adjustment range of half cycle of the clock signal CLK, for example.

The delay block 403 comprises n number of switches 421-1 through 421-$n$, n number of capacitors 422-1 through 422-$n$, and controls the switches 421 based on a control signal of n bits (n=32 for example) from the counter circuit 206. Thereby, the number of the capacitors 422 connected to the transmission path of the signal IN changes, and the delay of the signal IN is adjusted. The delay blocks 406, 409 and 412 respectively have the same configurations and operations as above.

The buffers provided in front of and behind each delay block have functions of driving the load capacitors in the delay block in order to concentratedly and accurately introduce a delay into one edge (rising edges of the signals F2 and F3). By concentratedly adjusting the delay of one edge, irregularity of linearity of adjustment interval due to an environment, processes or the like occurring when introducing a large delay is prevented.

The buffer 401 outputs the signal IN as the signal F1, the inverter 402 inverts the signal F1, and outputs the inverted signal to the delay block 403. The buffer 404 outputs the output signal of the delay block 403 to the inverter 402. The inverter 402 inverts the signal, and outputs the inverted signal to the delay block 406.

The buffer 407 outputs the output signal of the delay block 406 as the signal F2. The inverter 408 inverts the signal F2, and outputs the inverted signal to the delay block 409. The buffer 410 outputs the output signal of the delay block 409 to the inverter 411. The inverter 411 inverts the signal, and outputs the inverted signal to the delay block 412. The buffer 413 outputs the output signal of the delay block 412 as the signal F3.

The four delay blocks 403, 406, 409, and 412 are controlled by the same control signal, accordingly, these delay blocks are adjusted to always have the same delay value. Therefore, as shown in FIG. 3, the rising edge of the signal F2 is always at the mid-point between the rising edge of the signal F1 and the rising edge of the signal F3, and the falling edge of the signal F2 is always at the mid-point between the falling edge of the signal F1 and the falling edge of the signal F3.

The configuration and the operation of the variable delay circuit 209 are also the same as those of the variable delay circuit 207. However, in the variable delay circuit 209, the signal XINB is input instead of the signal IN, and the signal F2X is output instead of the signal F2.

Although in the example of FIG. 4, four delay blocks are provided, and one cycle of the signal IN is quadrisected in order to generate the signal F2 with the delay of T/4, it is possible to generate a signal with a delay of T/6 by providing six delay blocks. As this, by adjusting the number of the delay blocks, it is possible to introduce an arbitrary delay (phase difference) into the signal IN.

Also, by changing the configuration of the variable delay circuits, it is possible to adjust the delay of the falling edges of the delay signals concentratedly.

FIG. 5 shows a configuration example of the duty ratio correction circuit 210. This duty ratio correction circuit comprises a selector 501, and a flip-flop 502. The selector 501 selects and outputs the delay signal F2 when the signal IN is the logic "1", and selects and outputs the delay signal F2X when the signal IN is the logic "0". The flip-flop 502 latches the signal IN by using the output signal of the selector 501 as the clock signal, and outputs the latched signal as a signal OUT.

Figure 6:
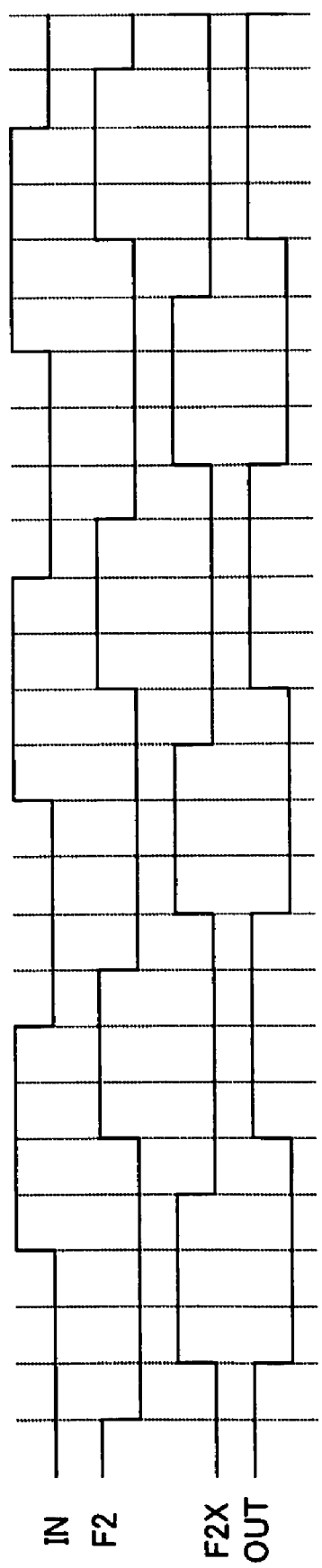
FIG. 6 shows a timing chart for the duty ratio correction circuit.

FIG. 6 shows a timing chart showing an operation of the duty ratio correction circuit of FIG. 5. In a convergence stage of the delay adjustment, the signal F2 rises and the signal F2X falls always while the signal IN is the logic "1" (High). Also, the signal F2 falls and the signal F2X rises always while the signal IN is the logic "0" (Low).

Therefore, while the signal IN is the logic "1", the value of the logic "1" is latched by the rising edge of the signal F2, and a rising edge of the signal OUT is formed. Also, while the signal IN is the logic "0", the value of the logic "0" is latched by the rising edge of the signal F2X, and the falling edge of the signal OUT is formed. This signal OUT is output as the signal QCKO.

Thus, the delay signal QCKO without the duty ratio variation as shown in FIG. 3 is generated. The signal IN is output as the signal CLKO, accordingly, a first output signal CLKO and a second output signal QCKO which is delayed from the signal CLKO by T/4 can be obtained.

Figure 7:
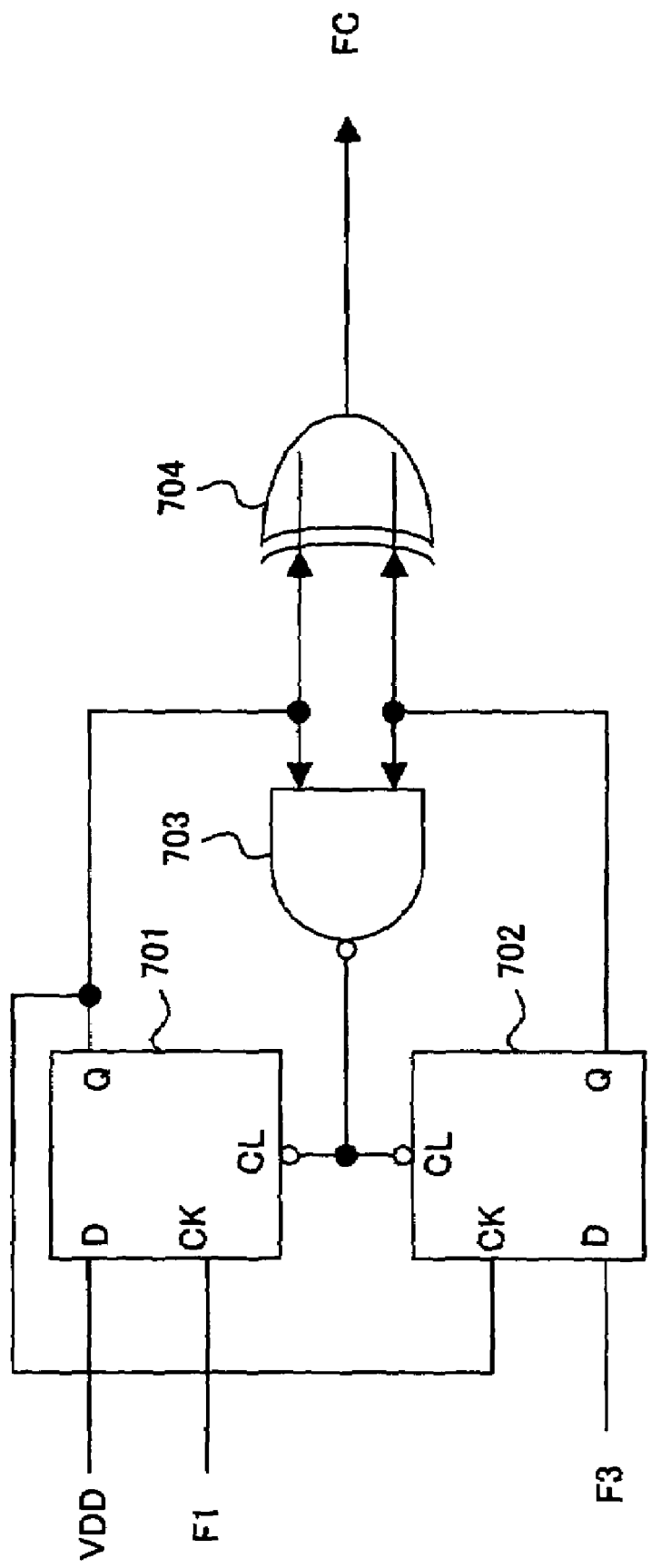
FIG. 7 shows a configuration of a phase generator.

FIG. 7 shows a configuration example of the phase generator 208. This phase generator comprises flip-flops 701 and 702, a NAND circuit 703, and an XOR circuit 704. The flip-flop 701 latches and outputs a signal VDD by using the signal F1 as a clock signal. The flip-flop 702 latches and outputs the signal F3 by using the output signal of the flip-flop 701 as the clock signal.

The NAND circuit 703 outputs the negation of a result of the AND operation between the output signals of the flip-flops 701 and 702. To clear terminals CL of the flip-flops 701 and 702, the inverted output signal of the NAND circuit 703 is input. The XOR circuit 704 outputs a result of the exclusive OR operation of the output signals of the flip-flops 701 and 702 as the signal FC.

Figure 8:
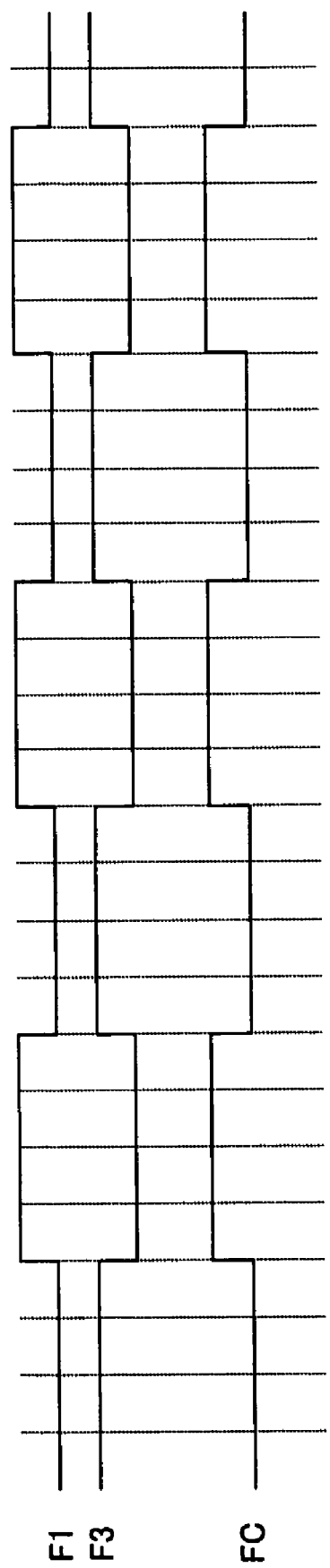
FIG. 8 shows a timing chart for the phase generator.

FIG. 8 shows a timing chart showing an operation of the phase generator of FIG. 7. The rising edges of the signal FC are formed so as to coincide with the rising edges of the signal F1. The falling edges of the signal FC are formed so as to coincide with the rising edges of the signal F3. Thereby, the phase relationships of the signal FC with respect to the signals F1 and F3 is maintained. As this, by providing the phase generator 208, it is possible to freely extract the phase relationships from a plurality of output signals of the variable delay circuit 207.

Figure 9:
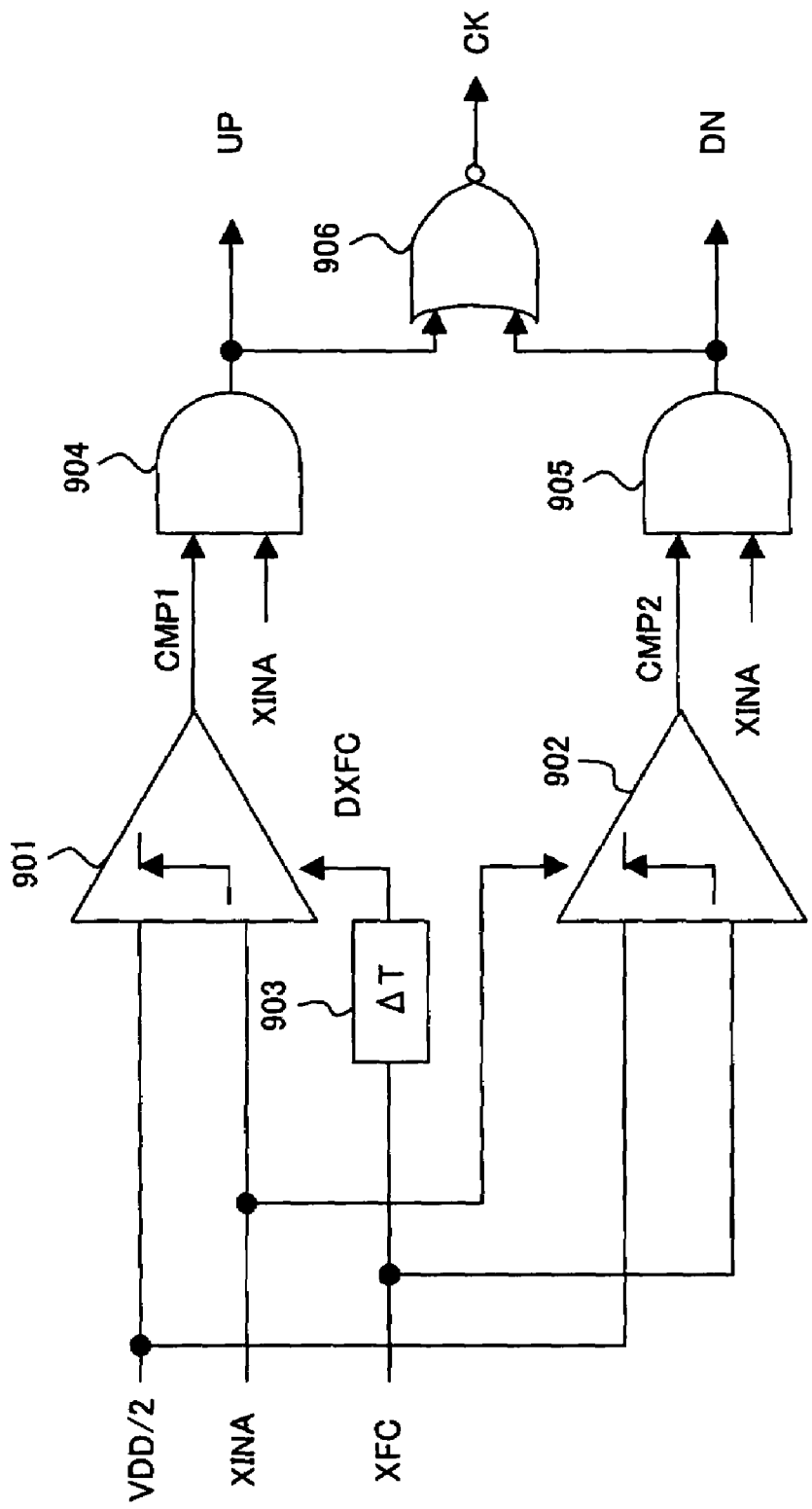
FIG. 9 shows a configuration of a phase detector.

FIG. 9 shows a configuration example of the phase detector 205. This phase detector comprises latching comparators 901 and 902, a delay circuit 903, AND circuits 904 and 905, and an NOR circuit 906.

The delay circuit 903 delays the rising edge of the signal XFC by ΔT, and outputs a signal DXFC. The comparator 901 compares the signal XINA and a threshold value signal VDD/2 in accordance with the signal DXFC, and outputs a signal CMP1 indicating the comparison result. The comparator 902 compares the signal XFC and the threshold value signal VDD/2 in accordance with the signal XINA, and outputs a signal CMP2 indicating the comparison result. The value of the signal VDD/2 is set to the mid-point between the High level and the Low level.

The AND circuit 902 outputs a result of the AND operation between the signal CMP1 and the signal XINA as a signal UP. The AND circuit 905 outputs a result of the AND operation between the signal CMP2 and the signal XINA as a signal DN. The NOR circuit 906 outputs the negation of a result of the AND operation between the signal UP and the signal DN as a signal CK. The signals UP and DN are respectively used as signals for instructing a count up (increasing of delay) and a count down (decreasing of delay), and the signal CK is used as the clock signal in the counter circuit 206.

Figure 10:
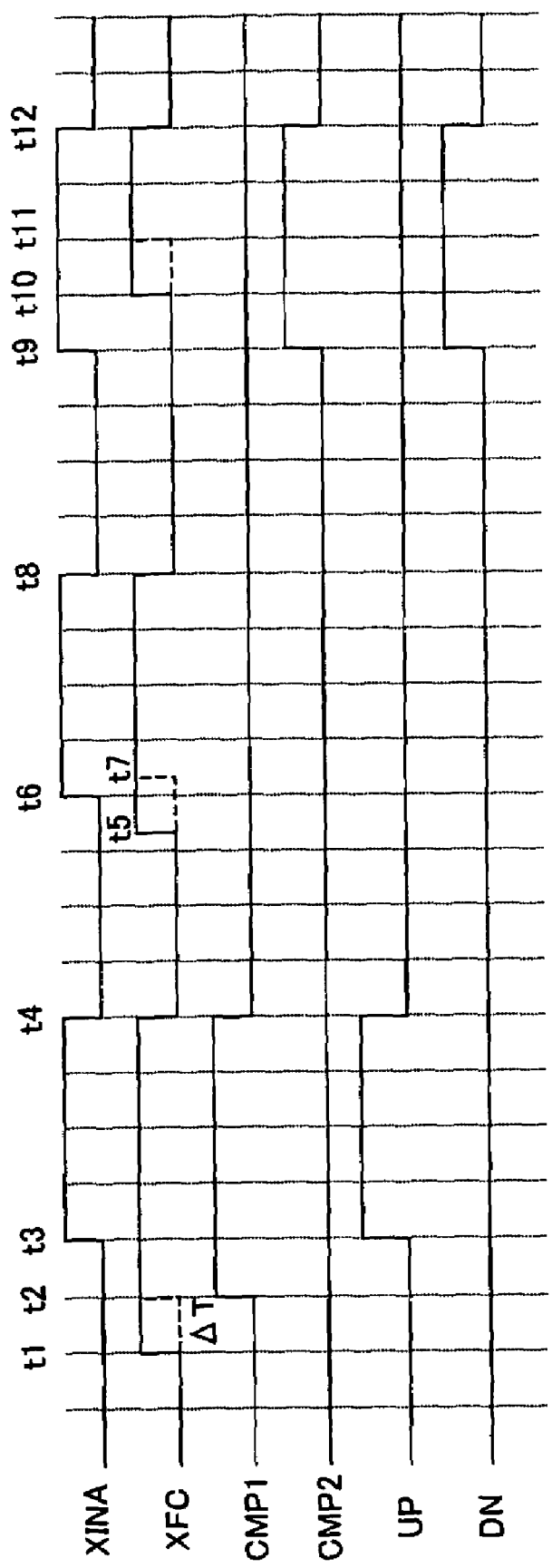
FIG. 10 shows a timing chart for the phase detector.

FIG. 10 shows a timing chart showing an operation of the phase detector of FIG. 9. It is the most desirable that when the phase detector 205 compares the phase relationships of the delay signal XFC and the reference signal XINA, it is desirable that the two signals overlap each other.

Actually, because the falling edge of the signal XFC is formed so as to coincide with the rising edge of the signal F1 by the phase generator 208, the falling edge of the signal XFC coincides with the falling edge of the signal XINA. However, because the rising edge of the signal XFC is formed so as to coincide with the rising edge of the signal F3, the rising edge of the signal XFC does not always coincide with the rising edge of the signal XINA.

Accordingly, the difference between the rising edges of the two signals is detected by the phase detector 205, and the delays of the variable delay circuits 207 and 209 are adjusted via the counter circuit 206, thereby, a feed back control is performed such that the signal XFC and the signal XINA overlap each other.

First, when the signal XFC rises at a time t1, and the signal XINA rises at a time t3 being slightly delayed, the signal DXFC rises at a time t2 which is posterior to the time t1 by ΔT as depicted by a dashed line, and falls together with the signal XFC at a time t4.

In the above case, the comparator 901 compares the signal XINA and the signal VDD/2 in accordance with the rising edge of the signal DXFC at the time t2. Upon this comparison, because the level of the signal XINA is lower than that of the signal VDD/2, the logic "1" is output as the signal CMP1, and the value is maintained until the signal DXFC falls.

The comparator 902 compares the signal XFC and the signal VDD/2 in accordance with the rising edge of the signal XINA at the time t3. Upon this comparison, because the level of the signal XFC is higher than that of the signal VDD/2, the logic "0" is output as the signal CMP2. As a result of this, the signal UP is the logic "1", and the signal DN remains the logic "0" during the period between the time t3 and the time t4.

Next, when the signal XFC rises at a time t5, and the signal XINA rises at a time t6 being slightly delayed, the signal DXFC rises at a time t7 which is posterior to the time t5 by ΔT as depicted by a dashed line, and falls together with the signal XFC at a time t8.

In this case, the comparator 901 compares the signal XINA and the signal VDD/2 at the time t7. Upon this comparison, because the level of the signal XINA is higher than that of the signal VDD/2, the logic "0" is output as the signal CMP1.

The comparator 902 compares the signal XFC and the signal VDD/2 at the time t6. Upon this comparison, because the level of the signal XFC is higher than that of the signal VDD/2, the logic "0" is output as the signal CMP2. As a result of this, both of the signal UP and the signal DN remain logic "0".

Next, when the signal XINA rises at a time t9, and the signal XFC rises at a time t10 being slightly delayed, the signal DXFC rises at a time t11 which is posterior to the time t10 by ΔT as depicted by a dashed line, and falls together with the signal XFC at a time t12.

In this case, the comparator 901 compares the signal XINA and the signal VDD/2 at the time t11. Upon this comparison, because the level of the signal XINA is higher than that of the signal VDD/2 at the time t11, the logic "0" is output as the signal CMP1.

The comparator 902 compares the signal XFC and the signal VDD/2 at the time t9. Upon this comparison, because the level of the signal XFC is lower than that of the signal VDD/2, the logic "1" is output as the signal CMP2, and the value is maintained until the signal XINA falls. As a result of this, the signal DN is the logic "1", and the signal UP remains the logic "0" during the period between the time t9 and the time t12.

As above, in the case that the rising edge of the signal XFC is prior to the rising edge of the signal XINA, a count up instruction is given to the counter circuit 206 based on the signal UP, and in the case that the rising edge of the signal XFC is posterior to the rising edge of the signal XINA, a count down instruction is given to the counter circuit 206 based on the signal DN.

Figure 11:
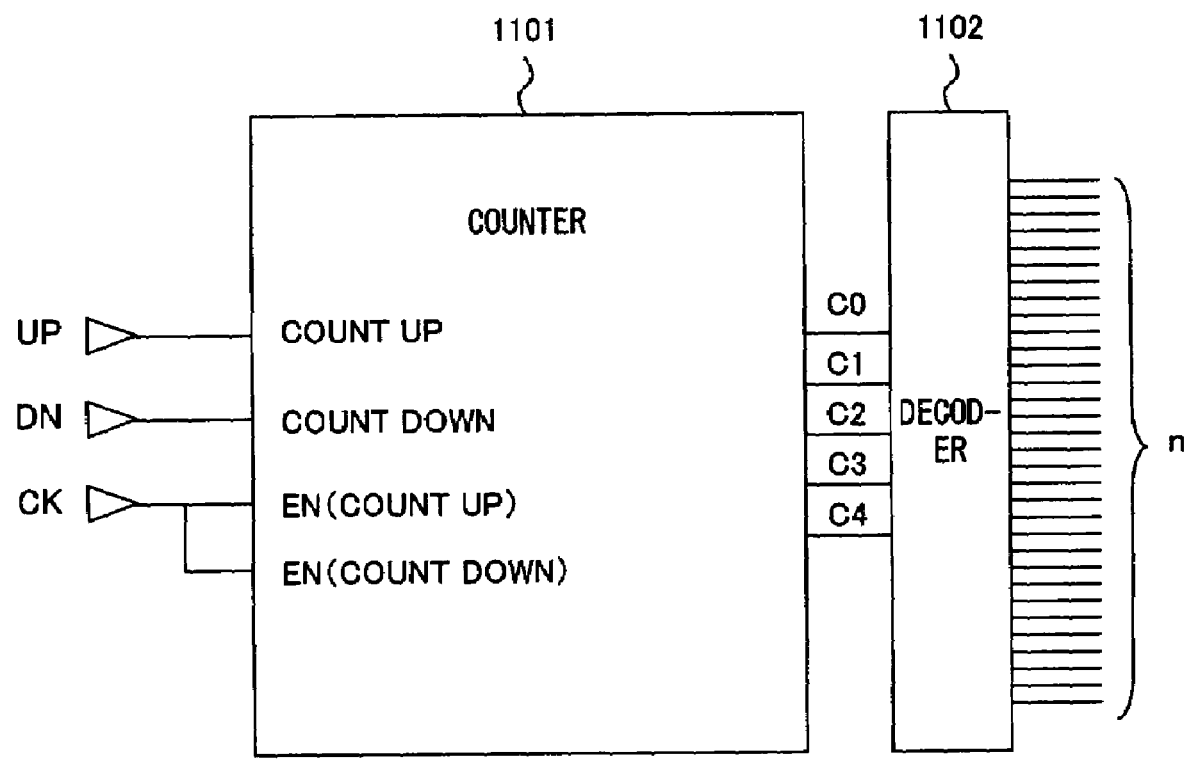
FIG. 11 shows a configuration of a first counter circuit.

FIG. 11 shows a configuration example of the counter circuit 206. This counter circuit comprises a reversible counter 1101, and a decoder 1102. The counter 1101 performs a count up operation when the signal UP is the logic "1" by using the signal CK as a clock signal, performs a count down operation when the signal DN is the logic "1", and outputs a count value C0 through C4 of five bits.

Accordingly, the count up operation is performed during the period between the time t3 and the time t4 of FIG. 10, and the count value is incremented by one. And during the period between the time t9 and the time t12, the count down operation is performed, and the count value is decremented by one.

The decoder 1102 decodes the count value of the counter circuit 1101, and generates a control signal of n bits. Based on this control signal, the switches 421-1 through 421-n of FIG. 4 are controlled, and the larger the counter value is, the larger the delays of the signals F2 and F3 become. Accordingly, when the signal UP becomes the logic "1", the delay of the rising edge of the signal XFC increases as shown in FIG. 10.

Next, other configuration examples of the variable delay circuits 207 and 209 of FIG. 2 will be explained, by referring to FIG. 12 through FIG. 14.

Figure 12:
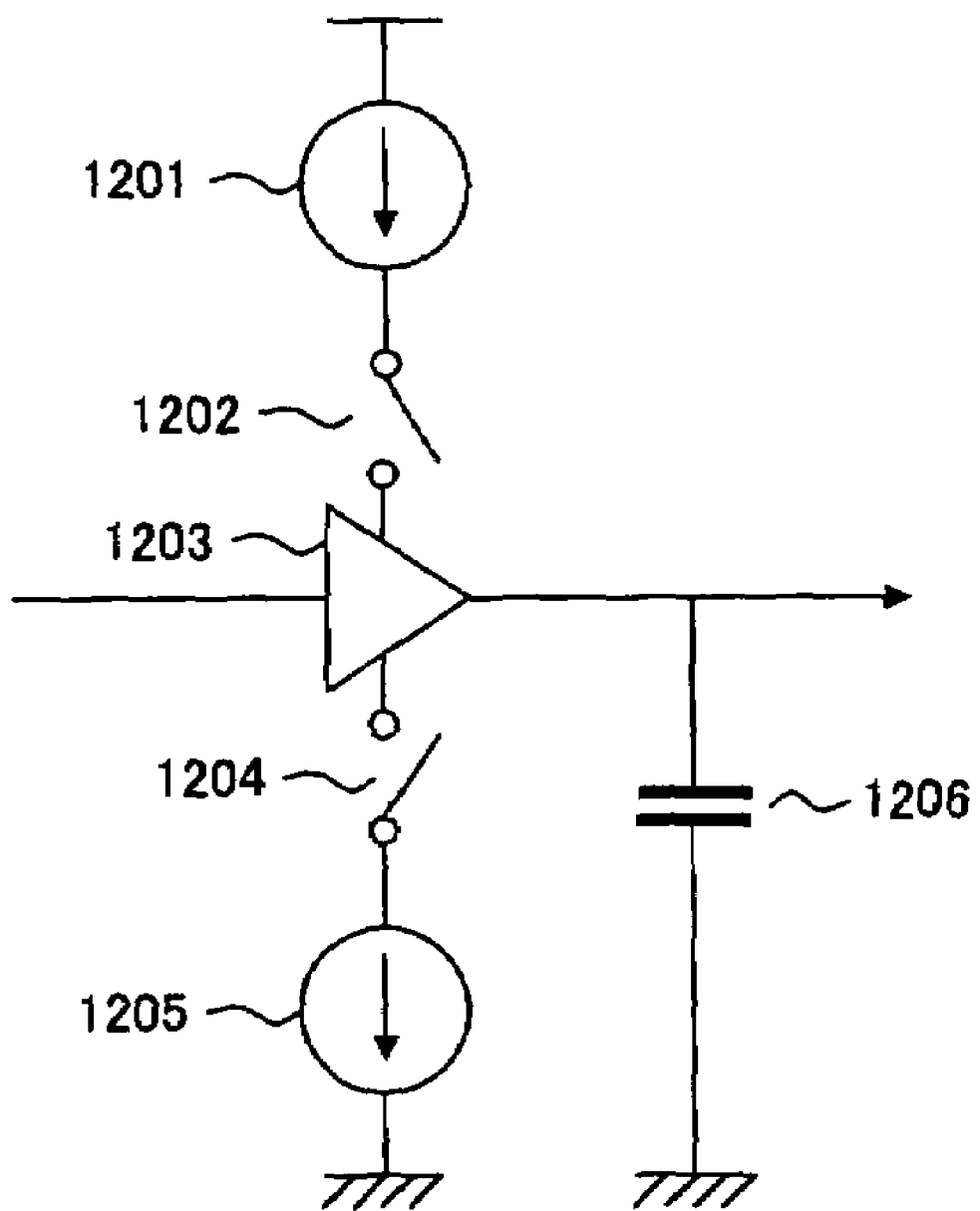
FIG. 12 shows a configuration of a second variable delay circuit.

FIG. 12 shows an example in which each of the delay blocks of FIG. 4 is configured of current sources and a capacitor, and a delay is adjusted based on a time during which a current flows. In this case each of the delay blocks comprises current sources 1201 and 1205, switches 1202 and 1204, a buffer 1203, and a capacitor 1206. The switches 1202 and 1204 are switched simultaneously based on one pulse signal. For example, the switches becomes on while the pulse signal is the logic "1" in order to flow currents to the buffer 1203, and becomes off while the pulse signal is the logic "0". Therefore, the larger the pulse width of the pulse signal is, the longer the time during which the current flows to the buffer 1203 is, and the delay of the signal becomes smaller.

Figure 13:
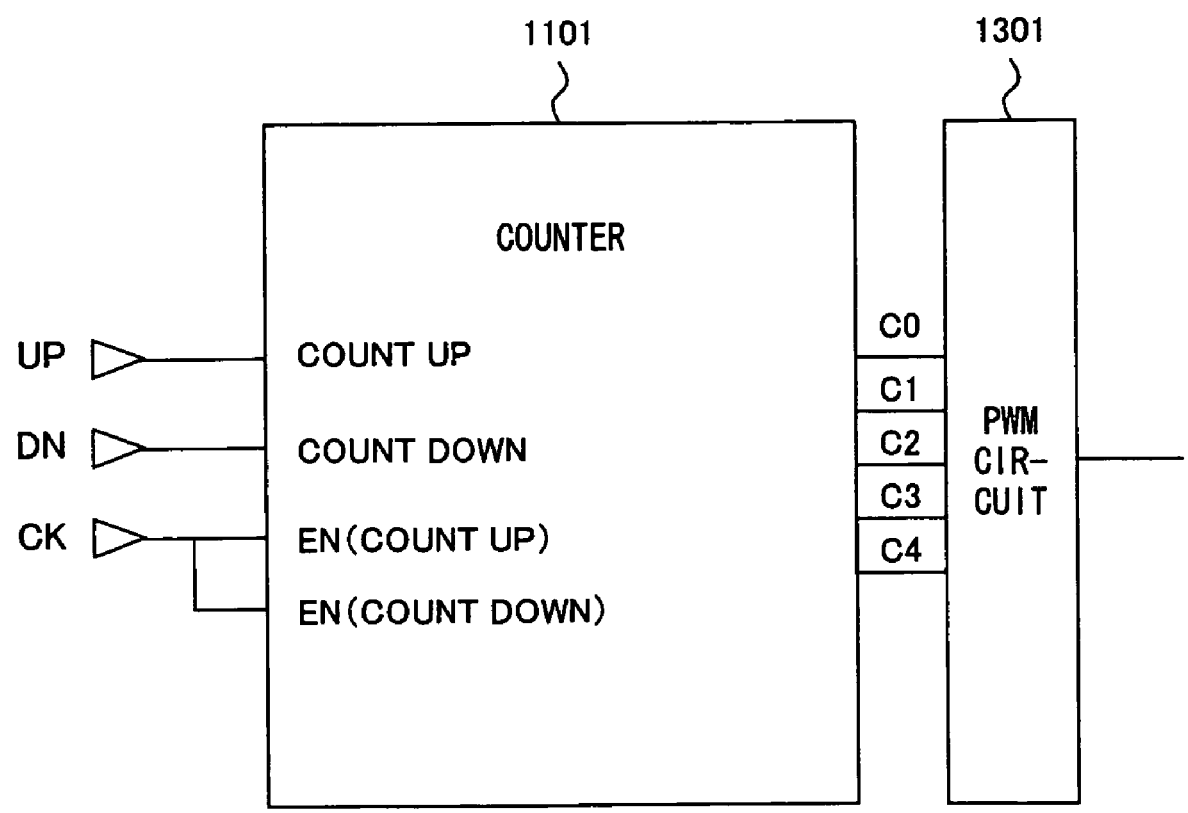
FIG. 13 shows a configuration of a second counter circuit.

In this case, in order to generate a pulse signal for controlling the switches 1202 and 1204, the counter circuit 1101 as shown in FIG. 13 is used. This counter circuit employs a configuration obtained by replacing the decoder 1102 with a pulse width modulation (PWM) circuit 1301 in the circuit of FIG. 11. The PWM circuit 1301 generates a pulse signal whose pulse width changes in accordance with the count value of the counter 1101. In the case that the switches 1202 and 1204 are on while the pulse signal is the logic "1", the larger the count value is, the smaller the pulse width is.

Figure 14:
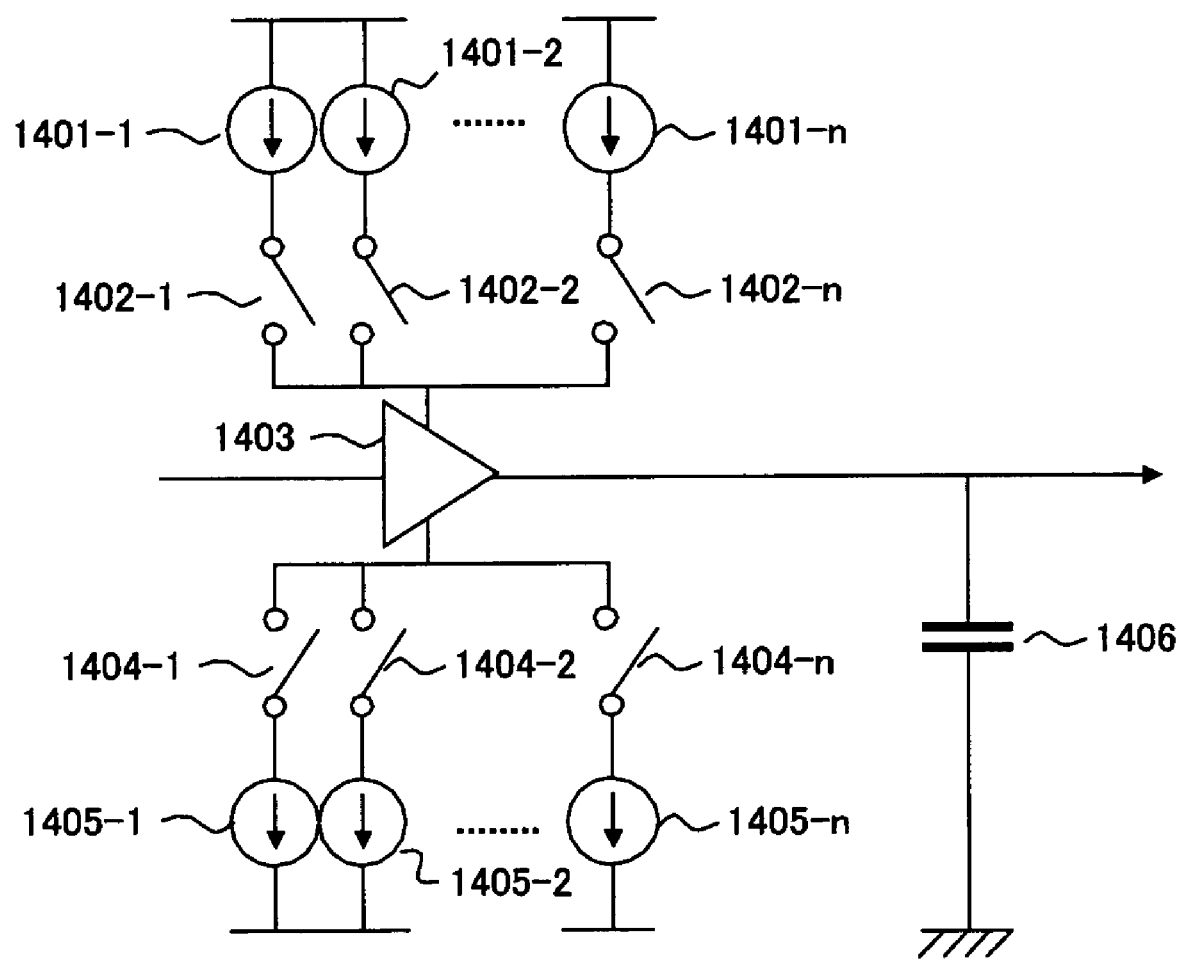
FIG. 14 shows a configuration of a third variable delay circuit.

FIG. 14 shows an example in which each of the respective delay blocks of FIG. 4 is configured of current sources and a capacitor, and a delay is adjusted by a current value. In this case, each of the delay blocks comprises 2n number of current sources 1401-1 through 1401-n, and 1405-1 through 1405-n, 2n number of switches 1402-1 through 1402-n, and 1404-1 through 1404-n, a buffer 1403, and a capacitor 1406.

The switches 1402-1 through 1402-n, and 1404-1 through 1404-n are controlled based on the control signal of n bits from the counter circuit of FIG. 11 similarly to the switches 421-1 through 421-n of FIG. 4. The switch 1402-i (i=1, . . . , n) is switched simultaneously with the switch 1404-i.

Additionally, in the DCL circuit of FIG. 2, the delay signal QCKO is generated from the clock signal CLK, however, this DCL circuit can be applied not only to the clock signal but also to any signal.

Also, in the timing chart of FIG. 3, it is possible to perform a delay control in which the rising edge of the signal QCKO is made to coincide with the falling edge of the signal F2X, and the falling edge of the signal QCKO is made to coincide with the falling edge of the signal F2. In this case, both edges of the signal QCKO are respectively delayed from the corresponding edges of the signal IN by the same value Δtf.

What is claimed is:

1. A delay control circuit, comprising:

a first variable delay circuit which delays an input signal to introduce a first delay into a first edge which is one of a rising edge and a falling edge of the input signal, thereby generates a first delay signal;

a second variable delay circuit which delays the input signal to introduce a second delay into a second edge which is the other one of the rising edge and the falling edge of the input signal, thereby generates a second delay signal;

a control circuit which generates a control signal for controlling the first variable delay circuit and the second variable delay circuit such that the first delay and the second delay are identical; and a generation circuit which combines the first edge of the first delay signal and the second edge of the second delay signal, thereby generates a third delay signal, wherein the generation circuit generates a rising edge of the third delay signal based on the first edge of the first delay signal and a falling edge of the third delay signal based on the second edge of the second delay signal, and the generation circuit includes a selection circuit for selecting the first edge of the first delay signal or the second edge of the second delay signal, and a latch circuit for latching the input signal by using the selected edge, and for generating the third delay signal.

2. The delay control circuit according to claim 1, wherein:

the second variable delay circuit has a configuration equivalent to that of the first variable delay circuit; and the control circuit outputs a control signal which is common to the first variable delay circuit and the second variable delay circuit.

3. The delay control circuit according to claim 2, further comprising:

an inverter circuit which inverts the input signal, and which outputs the inverted signal, wherein:

the second variable delay circuit delays the inverted signal, and generates the second delay signal.

4. The delay control circuit according to claim 1, wherein:

the first variable delay circuit and the second variable delay circuit respectively include a plurality of capacitor circuits, and a plurality of switch circuits for connecting the plurality of capacitor circuits to a transmission path of the input signal; and the control circuit adjusts the first delay and the second delay by switching the plurality of switch circuits with the control signal.

5. The delay control circuit according to claim 1, wherein:

the first variable delay circuit and the second variable delay circuit respectively include a capacitor circuit connected to a transmission path of the input signal, a plurality of current source circuits, and a plurality of switch circuits connecting the plurality of current source circuits to the transmission path; and the control circuit adjusts the first delay and the second delay by switching the plurality of switch circuits with the control signal.

6. The delay control circuit according to claim 1, wherein:

the first variable delay circuit and the second variable delay circuit respectively include a capacitor circuit connected to a transmission path of the input signal, a current source circuit, a switch circuit for connecting the current source circuit to the transmission path; and the control circuit adjusts the first delay and the second delay by switching the switch circuit with the control signal and adjusting a time during which the current source circuit is connected to the transmission path.

7. A delay control circuit, comprising:

a first variable delay circuit which delays an input signal to introduce a first delay into a first edge which is one of a rising edge and a falling edge of the input signal, thereby generates a first delay signal;

a second variable delay circuit which delays the input signal to introduce a second delay into a second edge which is the other one of the rising edge and the falling edge of the input signal, thereby generates a second delay signal;

a control circuit which generates a control signal for controlling the first variable delay circuit and the second variable delay circuit such that the first delay and the second delay are identical; and a generation circuit which combines the first edge of the first delay signal and the second edge of the second delay signal, thereby generates a third delay signal, wherein the generation circuit generates a rising edge of the third delay signal based on the first edge of the first delay signal and a falling edge of the third delay signal based on the second edge of the second delay signal, the first variable delay circuit delays the input signal, and generates a fourth delay signal; and the control circuit includes a phase generation circuit for generating a phase comparison signal by using the fourth delay signal, and a phase detection circuit for detecting a phase difference by comparing phase relationships of the input signal and the phase comparison signal, and generates the control signal based on the detected phase difference.

8. The delay control circuit according to claim 7, wherein:

the control circuit further includes a counter circuit for performing a count up operation or a count down operation based on the phase difference, and for outputting a count value, and generates the control signal from the count value.

9. The delay control circuit according to claim 7, wherein:

the phase detection circuit includes a first comparison circuit for comparing the input signal and a threshold value signal by using an edge of the phase comparison signal, and a second comparison circuit for comparing the phase comparison signal and the threshold value signal by using an edge of the input signal.

10. A method of controlling a delay, comprising:

delaying an input signal to introduce a first delay into a first edge which is one of a rising edge and a falling edge of the input signal, thereby generating a first delay signal;

delaying the input signal to introduce a second delay into a second edge which is the other one of the rising edge and the falling edge of the input signal, thereby generating a second delay signal;

controlling the first delay and the second delay such that the first delay and the second delay are identical;

selecting the first edge of the first delay signal or the second edge of the second delay signal;

latching the input signal based on a selected edge in the selecting; and combining the first edge of the first delay signal and the second edge of the second delay signal based on a latched input signal in the latching, thereby generating a third delay signal, wherein the generating the third delay signal generates a rising edge of the third delay signal based on the first edge of the first delay signal and a falling edge of the third delay signal based on the second edge of the second delay signal.

11. A delay control circuit, comprising:

a first variable delay circuit which delays an input signal to introduce a first delay into a first edge which is one of a rising edge and a falling edge of the input signal, thereby generates a first delay signal;

a second variable delay circuit which delays the input signal to introduce a second delay into a second edge which is the other one of the rising edge and the falling edge of the input signal, thereby generates a second delay signal;

a control circuit which generates a control signal for controlling the first variable delay circuit and the second variable delay circuit such that the first delay and the second delay are identical; and a generation circuit which combines the first edge of the first delay signal and the second edge of the second delay signal, thereby generates a third delay signal comprising a rising edge and a falling edge with an identical delay on the both edges from the both edges of the input signal.

* * * * *